United States Patent
Cheng et al.

(10) Patent No.: US 7,683,607 B2
(45) Date of Patent: Mar. 23, 2010

(54) CONNECTION TESTING APPARATUS AND METHOD AND CHIP USING THE SAME

(75) Inventors: Ju-Tien Cheng, Tainan County (TW); Yih-Long Tseng, Tainan County (TW); Hon-Yuan Leo, Tainan County (TW); Cheng-Chi Yen, Tainan County (TW)

(73) Assignee: Himax Display, Inc., Tainan County (TW)

( * ) Notice: Subject to any disclaimer, the term of this patent is extended or adjusted under 35 U.S.C. 154(b) by 177 days.

(21) Appl. No.: 11/860,754

(22) Filed: Sep. 25, 2007

(65) Prior Publication Data
US 2009/0079457 A1 Mar. 26, 2009

(51) Int. Cl.
*H01L 23/58* (2006.01)
(52) U.S. Cl. .................................. 324/158.1; 257/48
(58) Field of Classification Search .................. None
See application file for complete search history.

(56) References Cited

U.S. PATENT DOCUMENTS 5,598,313 A * 1/1997 Gersbach ..................... 361/56
6,025,708 A * 2/2000 Stickler ..................... 324/158.1
6,914,259 B2 * 7/2005 Sakiyama et al. ............. 257/48
7,400,134 B2 * 7/2008 Morishita et al. ........ 324/158.1
7,453,282 B2 * 11/2008 Arnold et al. .................. 326/16

FOREIGN PATENT DOCUMENTS

WO   WO 2005052612 A2 *  6/2005

* cited by examiner

*Primary Examiner*—Paresh Patel
(74) *Attorney, Agent, or Firm*—J.C. Patents

(57) ABSTRACT

A connection testing apparatus, a connection testing method, and a chip using the same are provided. The method can be used for testing connections between chips, so as to solve the problems that a conventional multi-chip connection test needs a plenty of test patterns, resulting in a long test time and a high test cost, and the condition of a connection failure is hard to be analyzed after a test failure. In the present invention, a voltage variation caused when an ESD element in a chip is conducted and a comparison circuits are used to determine whether a connection is correct. Furthermore, the test apparatus is built in the chip, so that the connection test may be accomplished quickly and efficiently. Once a connection failure occurs, the failed connection pin can also be found, so as to be favorable for engineering analysis and thereby effectively saving the test cost.

12 Claims, 3 Drawing Sheets

CONNECTION TESTING APPARATUS AND METHOD AND CHIP USING THE SAME

BACKGROUND OF THE INVENTION

1. Field of the Invention

The present invention relates to a connection testing apparatus and method, and more particularly to a method of testing whether connection points of chips in a multi-chip package are truly connected by using a voltage variation caused by a current path.

2. Description of Related Art

With the advancement of science and technology, consumer electronics products are in more and more demand. In these days when motility and action ability are paid more attention to, a conventional large-scale tool providing powerful functions is gradually abandoned by people and replaced with a highly portable mobile electronic product with perfect functions. Some new-era products emerge as the times require, such as portable videodisc systems and mini personal computers. However, due to the significant addition of functions, the number of external electronic elements is greatly increased, such as memories and power module elements, and under such a circumstance that the size must be reduced but the number of elements is increased, each system company is engaged in a topic about reducing the size of circuit modules, and as a result, the technologies of Systems On Chip (SOC) and Systems In Package (SIP) have emerged correspondingly.

In response to the requirements of SIP, a multi-chip package becomes the first goal that should be challenged. In the current technology about the multi-chip package, the most difficult technique is the technique of mass production test. When chips with quite different functions are combined together, it is not difficult to test whether individual chips are normal; however, if it is intended to test whether each connection point of each chip is connected well, a conventional method is only to test it by using two chips in hand-shake. The method of conducting mass production test according to the relevant functions and actions of two or more chips should be completed by using a plenty of test patterns through a test machine. The test patterns prolong test time and cause a high test cost. High enough fault coverage cannot be guaranteed even if a functional test has been passed. Moreover, even if a chip with faults is tested, which kind of connection fault causes the functional fault cannot be determined accurately, which does not be favorable for the whole subsequent engineering analysis at all.

SUMMARY OF THE INVENTION

The present invention is directed to provide a connection testing apparatus, used as an apparatus for testing the connection of a first substrate and a second substrate. The apparatus may be used to test each connection between the two substrates independently.

The present invention is further directed to provide a connection testing method for testing each connection point between the first substrate and the second substrate.

The present invention is further directed to provide a chip, so as to finish the test of each connection by using a built-in test circuit.

The present invention provides a connection testing apparatus for testing a connection between a first substrate and a second substrate. The connection testing apparatus includes a charge source, a charge draining unit, and a comparator. The charge source is disposed on the first substrate, for providing charges to a first end of the connection during a testing period. The charge draining unit is disposed on the second substrate, for draining the charges from a second end of the connection during the testing period. The comparator is disposed on the first substrate, for comparing a voltage at the first end of the connection with a reference voltage during the testing period, so as to determine whether the connection is correct.

The present invention provides a connection testing method for testing a connection between a first substrate and a second substrate. The connection testing method includes providing a charge source on the first substrate, so that the charge source provides charges to a first end of the connection during a testing period; providing a charge draining unit on the second substrate, so that the charge draining unit drains the charges from a second end of the connection in the testing period; and checking a voltage at the first end or the second end of the connection during the testing period, so as to determine whether the connection is correct.

The present invention provides a chip, which includes a kernel circuit, an output end, and a test circuit. The output end is coupled to the kernel circuit. The test circuit is coupled to the output end. The test circuit includes a charge source, a switch unit, and a comparator. The charge source provides charges to the output end during a testing period, and the switch unit turns on the charge source and the output end during the testing period. The comparator compares a voltage at the output end with a reference voltage during the testing period, so as to determine whether a connection between the output end and a second chip is correct.

Since the present invention provides a connection test structure using a current path, the connection test for a multi-substrate module, such as a multi-chip packaged integrated circuit, may be performed independently, so as to finish the connection test simply and rapidly, save test cost, and instantly find the position of a poor connection when the poor connection is tested and then solve it, thereby being favorable for the improvement of mass production yield and degree of stability.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
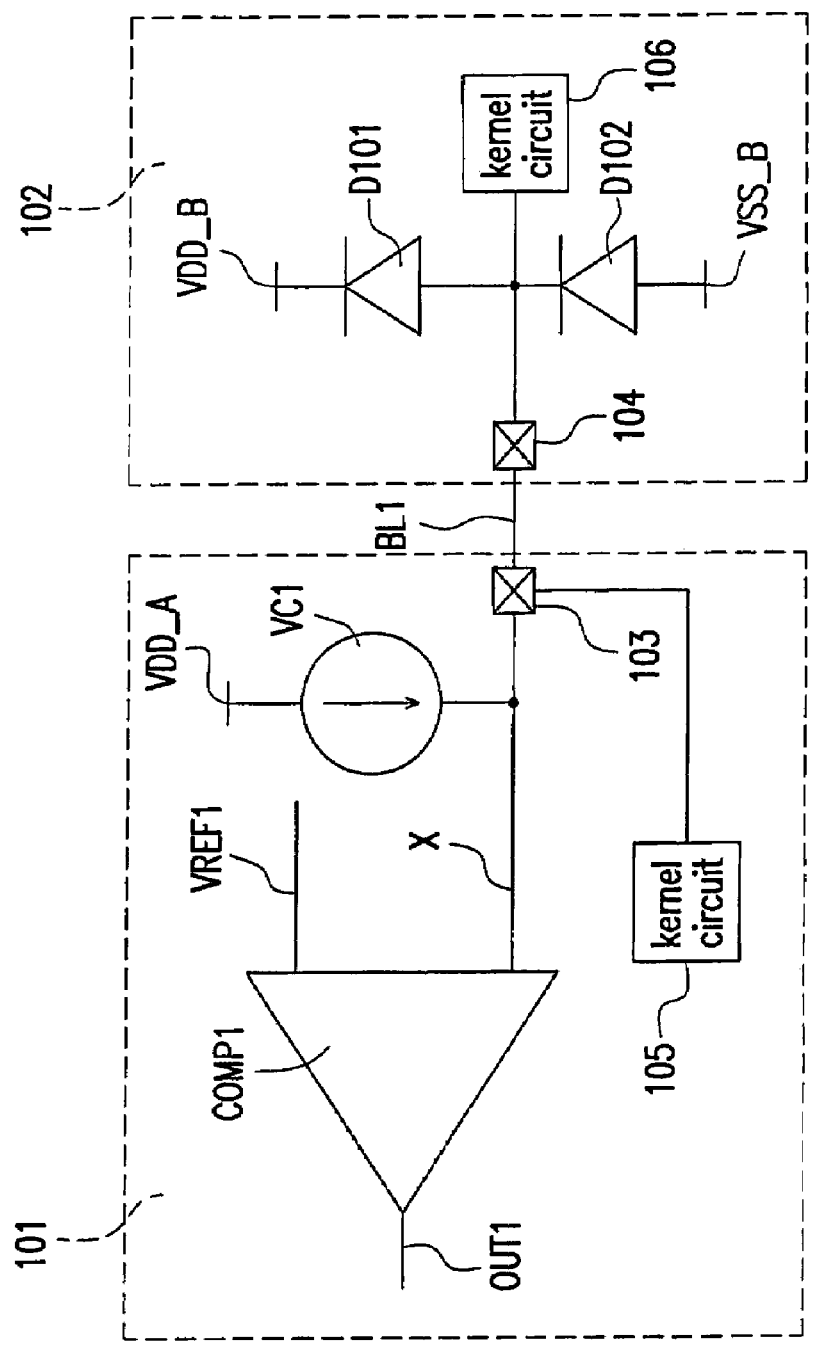
FIG. 1 is a first embodiment of the connection test in the present invention.

FIG. 1 is an embodiment of a connection testing apparatus. Referring to FIG. 1, a kernel circuit 105 of a first substrate (for example, an integrated circuit chip 101) and a kernel circuit 106 of a second substrate (for example, another integrated circuit chip 102) are connected with each other through an output end (for example, a pad 103), a connection BL1, and another output end (for example, a pad 104). The connection BL1 may be a weld line between the pad 103 and the pad 104. The connection testing apparatus is used to test the connection BL1 between the chip 101 and the chip 102.

In this embodiment, the chip 101 finishes the test of the connection BL1 by using a built-in test circuit. The built-in test circuit includes a charge source VC1 and a comparator COMP1. The chip 102 includes a first charge draining unit D101 and a second charge draining unit D102. The charge draining unit D101 and the charge draining unit D102 are both coupled to the second end (i.e., the pad 104) of the connection BL1. The charge draining unit D101 is further coupled to a system power wire VDD_B of the chip 102, and the charge draining unit D102 is further coupled to a system ground wire VSS_B of the chip 102. The charge draining units D101 and D102 are diode circuits and each can be formed with diode-connected transistor. In another embodiment, the charge draining units D101 and D102 may also be electrostatic discharge (ESD) protection elements disposed on the chip 102.

One end of the charge source VC1 is coupled to a system power wire VDD_A of the chip 101. The charge source VC1 can be realized by any means, for example, the charge source VC1 may be a pull-up resistor or a transistor. In addition, in the connection testing apparatus, a first input end of the comparator COMP1 receives a reference voltage VREF1, and a second input end X is coupled to a first end (i.e., the pad 103) of the connection BL1. In the present invention, the reference voltage VREF1 may be set upon actual requirements, for example, the reference voltage VREF1 may be set to be a value equal to a turn-on voltage of the first charge draining unit D101.

During a testing period, the system power wire VDD_A of the chip 101 is coupled to a system voltage, and the system power wire VDD_B of the chip 102 is grounded. Therefore, in the connection testing apparatus, if the connection BL1 is a correct connection, the charge source VC1 disposed on the chip 101 and the charge draining unit D101 disposed on the chip 102 form a current path. That is, the first charge draining unit D101 is turned on as a forward bias thereof is larger than the turn-on voltage, so the charge source VC1 may output charges, and the charges are drained by the first charge draining unit D101. Therefore, a potential at the first end (or the second end) of the connection BL1 is similar to the turn-on voltage of the first charge draining unit D101. If the connection BL1 is incorrect (for example, disconnected), the current path between the charge source VC1 and the charge draining unit D101 suffers a large impedance, and the potential at the first end of the connection BL1 is much larger than the turn-on voltage of the first charge draining unit D101. In this embodiment of the present invention, the potential at the first end of the connection BL1 may substantially equal to the system voltage.

In other words, during the testing period, the comparator COMP 1 checks the voltage at one end of the connection BL1 to determine whether the connection BL1 is correct. That is, the comparator COMP1 compares the voltage at the first end (i.e., the pad 103) of the connection BL1 with the reference voltage VREF1. If the connection BL1 is correct, because the voltage at the first end of the connection BL1 is similar to the reference voltage VREF1, an output end OUT1 of the comparator COMP1 outputs a logic level representing a correct connection, and thus it can be known that the connection BL1 is truly connected. If the connection BL1 is an incorrect connection, the second end of the connection BL1 will exhibit a high impedance state. At this time, the first end of the connection BL1 is pulled up to a level approaching the voltage level of the system power due to the charge source VC1. Since the voltage at the first end of the connection BL1 is larger than the reference voltage VREF1, the output end OUT1 of the comparator COMP1 outputs a logic level representing an incorrect connection, and thus it can be known that the connection is not truly connected.

Figure 2:
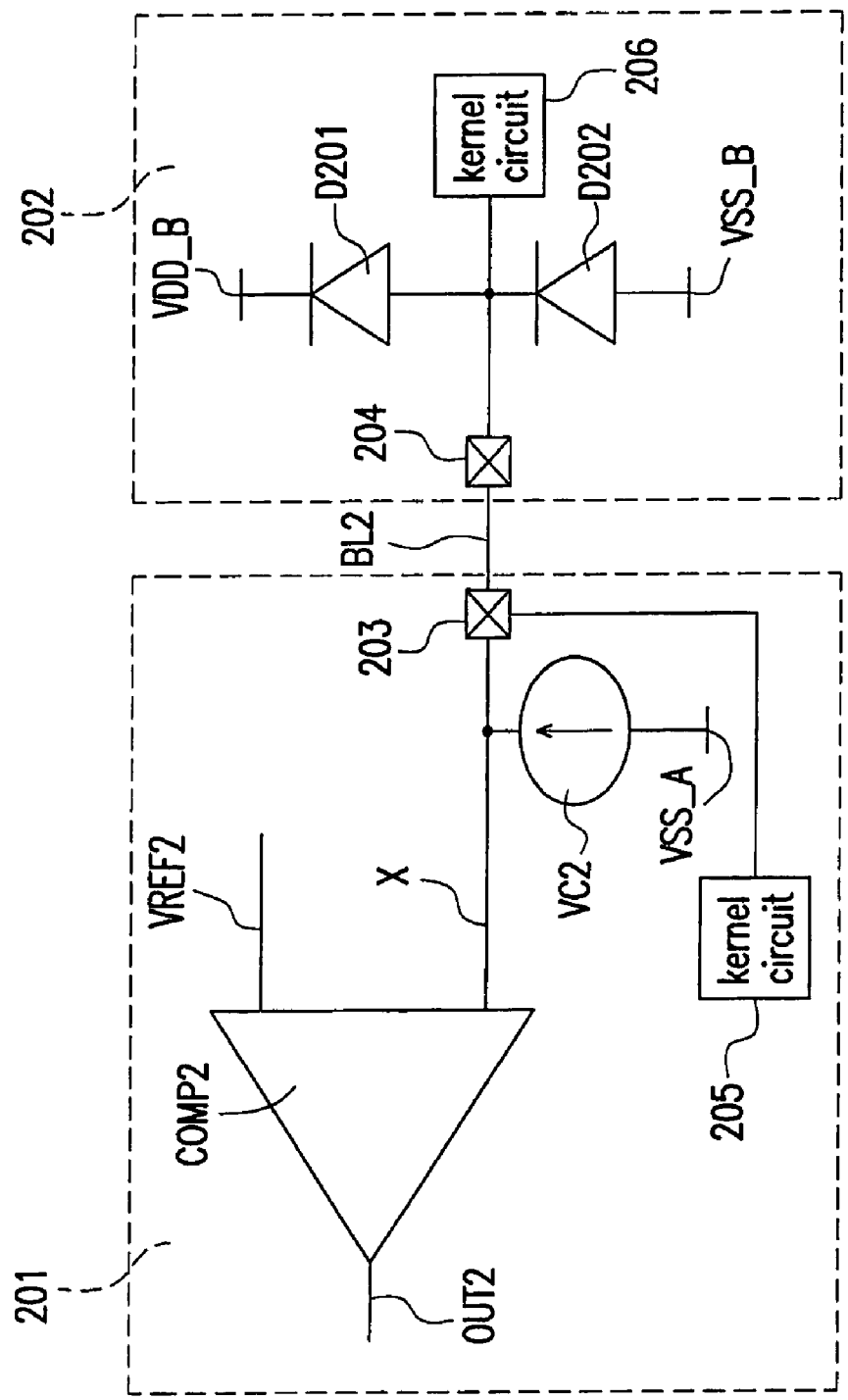
FIG. 2 is a second embodiment of the connection test in the present invention.

FIG. 2 is another embodiment of the connection testing apparatus. Referring to FIG. 2, a kernel circuit 205 of a first substrate (for example, an integrated circuit chip 201) and a kernel circuit 206 of a second substrate (for example, another integrated circuit chip 202) are connected with each other through an output end (for example, a pad 203), a connection BL2, and another output end (for example, a pad 204). The connection BL2 may be a weld line between the pad 203 and the pad 204. The connection testing apparatus is used to test the connection BL2 between the chip 201 and the chip 202. In this embodiment, the chip 201 finishes the test of the connection BL2 by using a built-in test circuit. The built-in test circuit includes a charge source VC2 and a comparator COMP2. The chip 202 includes a first charge draining unit D201 and a second charge draining unit D202. The charge draining unit D201 and the charge draining unit D202 are both coupled to a second end (i.e., the pad 204) of the connection BL2. The charge draining unit D201 is further coupled to a system power wire VDD_B of the chip 202, and the charge draining unit D202 is further coupled to a system ground wire VSS_B of the chip 202. The charge draining units D201 and D202 are diode circuits and each can be formed with diode-connected transistor. In another embodiment, the charge draining units D101 and D102 also may be ESD protection elements disposed on the chip 202.

In this embodiment, one end of the charge source VC2 is coupled to a system ground wire VSS_A of the chip 201. The charge source VC2 can be realized by any means, for example, the charge source VC2 may be a pull-down resistor or a transistor. In addition, in the connection testing apparatus, a first input end of the comparator COMP2 receives a reference voltage VREF2, and a second input end X is coupled to the first end (i.e., the pad 203) of the connection BL2. In the present invention, the reference voltage VREF2 may be set upon actual requirements, for example, the reference voltage VREF2 may be set to be a value obtained by subtracting a turn-on voltage of the second charge draining unit D202 from a system power supply voltage.

During a testing period, the system ground wire VSS_B of the chip 202 is coupled to a system voltage, and the system ground wire VSS_A of the chip 201 is grounded. Therefore, in the connection testing apparatus, if the connection BL2 is a correct connection, the charge source VC2 disposed on the chip 201 and the charge draining unit D202 disposed on the chip 202 form a current path. That is, the second charge draining unit D202 is turned on as a forward bias thereof is larger than the turn-on voltage, so the charge source VC2 outputs charges, and the charges are drained by the second charge draining unit D202. Therefore, the first or second end of the connection BL2 will have a potential approaching a value obtained by subtracting the turn-on voltage of the second charge draining unit D202 from a system voltage. The comparator COMP2 compares a voltage at the first end of the connection with the reference voltage VREF2, and since the voltage at the first end of the connection BL2 is similar to the reference voltage VREF2, an output end OUT2 of the comparator COMP2 outputs a logic level representing a correct connection, and thus it can be known that the connection BL2 is correct.

If the connection BL2 is incorrect (for example, disconnected), the second end of the connection BL2 will exhibit a high impedance state. That is, the current path between the charge source VC2 and the charge draining unit D202 will have a high impedance. The first end of the connection BL2 is pulled down to a level approaching the ground level of the system due to the charge source VC2. The comparator COMP2 compares the voltage at the first end of the connection BL2 with the reference voltage VREF2, and the output end OUT2 of the comparator outputs a logic level representing an incorrect connection, and thus it can be known that the connection is not truly connected.

Figure 3:
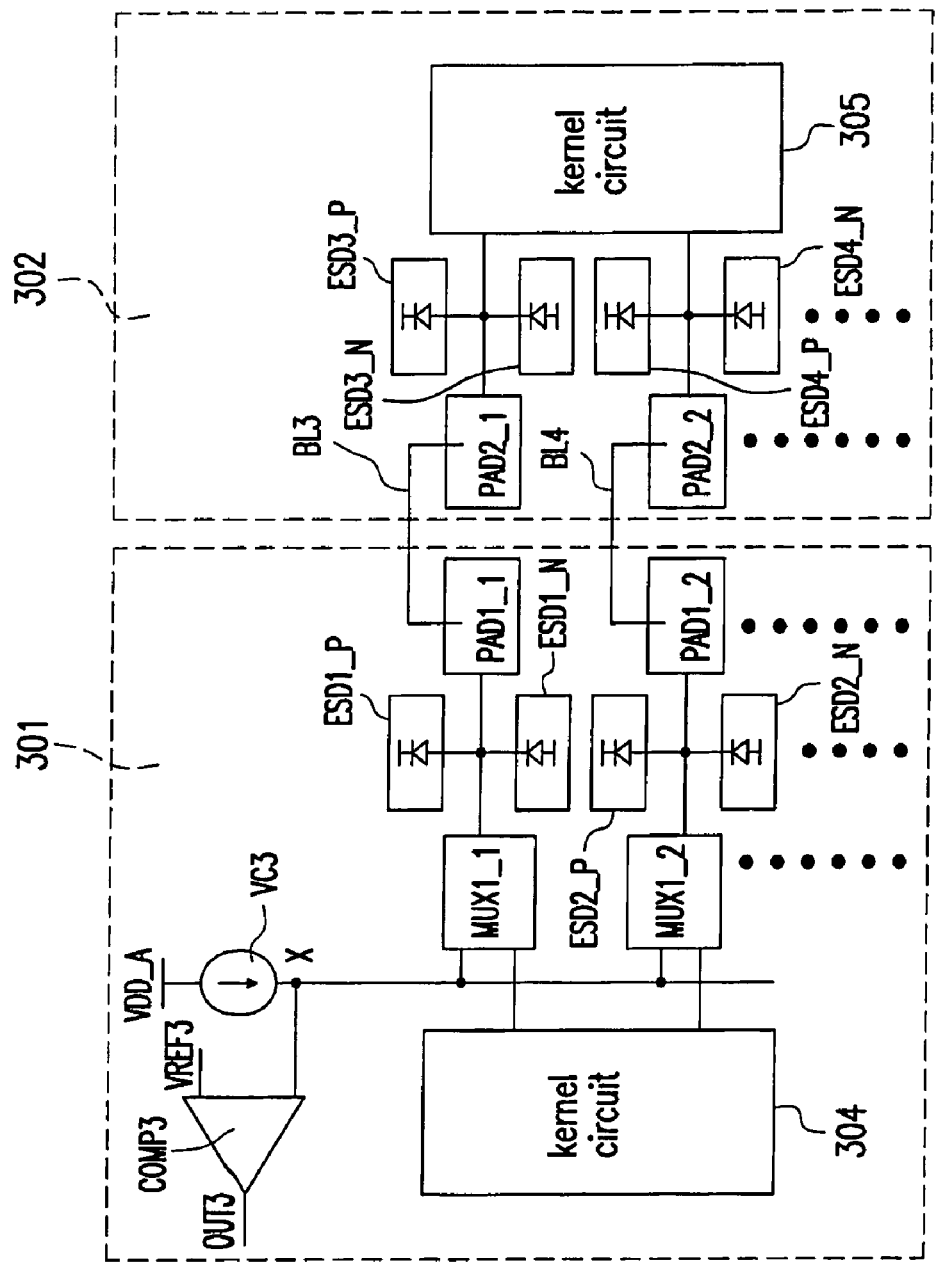
FIG. 3 is a third embodiment of the connection test in the present invention.

FIG. 3 is a connection testing apparatus according to another embodiment. A kernel circuit 304 of a first substrate (for example, an integrated circuit chip 301) and a kernel circuit 305 of a second substrate (for example, an integrated circuit chip 302) are connected with each other through switch units (for example, switch units MUX1_1 and MUX1_2), output ends (for example, pads PAD1_1 and PAD1_2), connection lines (for example, connections BL3 and BL4), and other output ends (for example, pads PAD2_1 and PAD2_2). The connections BL3 and BL4 may be weld lines between the pads. For example, between the chips 301 and 302, two ends of the first connection BL3 are respectively welded onto the pad PAD1_1 and the pad PAD2_1 by means of bonding, and the two ends of the second connection BL2 are respectively welded onto the pad PAD1_2 and the pad PAD2_2. The connection testing apparatus is used to test the connection between the chip 301 and the chip 302. In this embodiment, the chip 301 finishes the test of the connections BL3 and BL4 by using a built-in test circuit. The built-in test circuit includes the switch unit MUX1_1, the switch unit MUX1_2, a charge source VC3, and a comparator COMP3.

Generally, in order to protect the kernel circuits on the chips from being damaged by ESD, at least one electrostatic discharge (ESD) element is disposed around each of the pads. In this embodiment, the ESD elements ESD1_P and ESD1_N are coupled to the pad PAD1_, and the ESD elements ESD2_P and ESD2_N are coupled to the pad PAD1_2. Similarly, in the chip 302, the ESD elements ESD3_P and ESD3_N are coupled to the pad PAD2_1, and the ESD elements ESD4_P and ESD4_N are coupled to the pad PAD2_2. In this embodiment, the ESD elements ESD3_P, ESD3_N, ESD4_P, and ESD4_N are diodes and each can be formed with diode-connected transistor. Herein, the ESD elements in the chip 302 serve as charge draining units in the connection testing apparatus, and realize the connection testing apparatus together with the charge source VC3 and the comparator COMP3 in the chip 301.

As shown in FIG. 3, in the first chip 301, one end of the charge source VC3 is coupled to a system power wire VDD_A, and the other end is coupled to a first end of the first switch unit MUX1_1 and a first end of the second switch unit MUX1_2. The charge source VC3 can be realized by any means, for example, the charge source VC3 may be a pull-up resistor or a transistor. In addition, in the connection testing apparatus, a first input end of the comparator COMP3 receives a reference voltage VREF3, and a second input end X is coupled to the first end of the first switch unit MUX1_1 and the first end of the second switch unit MUX1_2. In the present invention, the reference voltage VREF3 may be set upon actual requirements, for example, the reference voltage VREF3 is set to be a value equal to a turn-on voltage of a charge draining unit (for example, the ESD element ESD3_P).

A second end of the first switch unit MUX1_1 and a second end of the second switch unit MUX1_2 are coupled to the kernel circuit 304. A third end of the first switch unit MUX1_1 is coupled to the pad PAD1_1. A third end of the second switch unit MUX1_2 is coupled to the pad PAD1_2. In each switch unit, during the testing period, the third end may be connected to the first end, and during normal operation, the third end is connected to the second end. Therefore, when the connection BL3 is to be tested, the switch unit MUX1_1 electrically connects the charge source VC3 and the pad PAD1_1, and other switch units (for example, the switch unit MUX1_2) will disconnect electrical paths between the charge source VC3 and other pads (such as the pad PAD1_2). When the connection BL4 is to be tested, the switch unit MUX1_2 electrically connects the charge source VC3 and the pad PAD1_2, and other switch units (for example, the switch unit MUX1_1) will disconnect the electrical paths between the charge source VC3 and other pads (such as the pad PAD1_1).

During the testing period, the system power wire VDD_A of the chip 301 is coupled to a system voltage, and the first charge draining unit (i.e., the ESD element ESD3_P) of the chip 302 is grounded. Therefore, in a first sub-period of the testing period, the first switch unit MUX1_1 electrically connects the charge source VC3 and the pad PAD1_1, and other switch units (for example, the switch unit MUX1_2) will disconnect the electrical paths between the charge source VC3 and other pads (for example, the pad PAD1_2). At this time, if the first connection BL3 is correct (i.e., favorable connection), the charge source VC3 sends charges to the first charge draining unit (i.e., the ESD element ESD3_P) to be drained. Then, the comparator COMP3 is used to compare a voltage at the first end at the first connection BL3 with the reference voltage VREF3, and an output end OUT3 of the comparator COMP3 outputs a logic level representing a correct connection, and thus it can be known that the first connection BL3 is truly connected. If the first connection BL3 is an incorrect connection, the voltage at the first end (i.e., the pad PAD1_1) of the first connection BL3 will approach system voltage. Therefore, after the comparator COMP3 compares the difference between the voltage at the first end (i.e., the pad PAD1_1) of the first connection BL3 and the reference voltage VREF3, the output end OUT3 outputs a logic level representing an incorrect logic level, and thus it can be known that the first connection BL3 is not truly connected.

Then, in a second sub-period of the testing period, the second switch unit MUX1_2 electrically connects the charge source VC3 and the pad PAD1_2, and the switch unit (for example, the switch unit MUX1_1) disconnects the electrical paths between the charge source VC3 and other pads (for example, the pad PAD1_1). The second charge draining unit (i.e., the ESD element ESD4_P) of the chip 302 is grounded. At this point, if the second connection BL4 is a correct connection, the charge source VC3 sends charges to the second charge draining unit (i.e., the ESD element ESD4_P) to be drained. Then, the comparator COMP3 is used to compare the voltage at the first end of the second connection BL4 with the reference voltage VREF3, and the output end OUT3 of the comparator COMP3 outputs a logic level representing a correct connection, and thus it can be known that the second connection BL4 is truly connected. If the second connection BL4 is an incorrect connection, the voltage at the first end (i.e., the pad PAD1_2) of the second connection BL4 will approach the system voltage. The comparator COMP3 compares the difference between the voltage at the first end (i.e., the pad PAD1_2) of the second connection BL4 and the reference voltage VREF3, the output end OUT3 outputs a logic level representing an incorrect connection, and thus it can be known that the second connection BL4 is not truly connected.

In a similar way, the testing steps are repeated, thereby finishing all connection tests between the first chip 301 and the second chip 302. According to the records of each connection tests during the testing period, whether each connection is correct can be known, so as to finish the connection test simply and rapidly, save test cost, and instantly find the position of a poor connection when the poor connection is tested and then solve it, thereby being favorable for the improvement of mass production yield and degree of stability.

In view of the above, in the present invention, the connection test of a multi-chip package may be performed only through establishing a simple test circuit without a large number of test patterns and a long test time in the conventional technology, thereby knowing the test results of each connection more clearly and being much favorable for package engineering analysis.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A connection testing apparatus, for testing a first connection and a second connection between a first substrate and a second substrate, comprising:
    a charge source, disposed on the first substrate, for providing charges to a first end of the first connection during a testing period;
    a first charge draining unit, disposed on the second substrate, for draining the charges from a second end of the first connection during the testing period;
    a second charge draining unit, disposed on the second substrate, for draining charges from a second end of the second connection during the testing period; and
    a first switch unit, disposed on the first substrate and coupled between the charge source and the first end of the first connection, so that the charge source is electrically connected to the first end of the first connection during a first sub-period of the testing period;
    a second switch unit, disposed on the first substrate and coupled between the charge source and a first end of the second connection, so that the charge source is electrically connected to the first end of the second connection during a second sub-period of the testing period; and
    a comparator, disposed on the first substrate, for comparing a voltage at the first end of the first connection with a reference voltage during the testing period, so as to determine whether the first connection is correct, and the comparator further comparing a voltage at the first end of the second connection and the reference voltage during the second sub-period of the testing period, so as to determine whether the second connection is correct.

2. The connection testing apparatus as claimed in claim 1, further comprising a switch unit disposed on the first substrate, for electrically connecting the charge source to the first end of the connection during the testing period.

3. The connection testing apparatus as claimed in claim 1, wherein when the connection is correct, the charge source is electrically connected to the charge draining unit on the second substrate through the connection, so that the comparator outputs a first value to determine that the connection is correct.

4. The connection testing apparatus as claimed in claim 1, wherein when the connection is incorrect, the charge source and the charge draining unit on the second substrate are disconnected, so that the comparator outputs a second value to determine that the connection is incorrect.

5. The connection testing apparatus as claimed in claim 1, wherein the first substrate is a first chip, and the second substrate is a second chip.

6. The connection testing apparatus as claimed in claim 1, wherein the charge source comprises a current source.

7. The connection testing apparatus as claimed in claim 1, wherein the charge source comprises a pull-up resistor with a first end coupled to a system voltage and a second end coupled to the first end of the connection.

8. The connection testing apparatus as claimed in claim 1, wherein the charge source comprises a pull-down resistor with a first end coupled to a ground voltage and a second end coupled to the first end of the connection.

9. The connection testing apparatus as claimed in claim 1, wherein the charge draining unit comprises an electrostatic discharge element.

10. The connection testing apparatus as claimed in claim 1, wherein the charge draining unit comprises a diode, and during the testing period, a cathode of the diode is coupled to a ground voltage, and an anode of the diode is coupled to the second end of the connection.

11. The connection testing apparatus as claimed in claim 1, wherein the charge draining unit comprises a diode, and during the testing period, an anode of the diode is coupled to a system voltage, and a cathode of the diode is coupled to the second end of the connection.

12. The connection testing apparatus as claimed in claim 1, wherein the first switch unit and the second switch unit are multiplexers.

* * * * *